United States Patent
Uneme et al.

(10) Patent No.: US 11,780,386 B2
(45) Date of Patent: Oct. 10, 2023

(54) CABLE CONNECTION STRUCTURE OF POWER CONTROL UNIT

(71) Applicant: Honda Motor Co., Ltd., Tokyo (JP)

(72) Inventors: Takahiro Uneme, Tokyo (JP); Dai Ishii, Tokyo (JP)

(73) Assignee: Honda Motor Co., Ltd., Tokyo (JP)

( * ) Notice: Subject to any disclaimer, the term of this patent is extended or adjusted under 35 U.S.C. 154(b) by 186 days.

(21) Appl. No.: 17/522,870

(22) Filed: Nov. 9, 2021

(65) Prior Publication Data
US 2022/0176896 A1    Jun. 9, 2022

(30) Foreign Application Priority Data
Dec. 4, 2020    (JP) .................. 2020-202274

(51) Int. Cl.
| | | |
|---|---|---|
| B60R 16/02 | (2006.01) | |
| B60K 6/405 | (2007.10) | |
| H05K 5/02 | (2006.01) | |
| H02K 11/30 | (2016.01) | |
| B60K 1/04 | (2019.01) | |

(52) U.S. Cl.
CPC ............... B60R 16/02 (2013.01); B60K 1/04 (2013.01); B60K 6/405 (2013.01); H02K 11/30 (2016.01); H05K 5/0247 (2013.01); B60L 2210/42 (2013.01)

(58) Field of Classification Search
None
See application file for complete search history.

(56) References Cited

U.S. PATENT DOCUMENTS

| | | | |
|---|---|---|---|
| 8,087,957 B2 | 1/2012 | Komatsu | |
| 8,939,797 B2 * | 1/2015 | Ciampolini | .............. H01R 4/34 439/657 |
| 10,128,722 B2 | 11/2018 | Goto et al. | |
| 10,766,347 B2 | 9/2020 | Iwasa et al. | |

(Continued)

FOREIGN PATENT DOCUMENTS

| | | |
|---|---|---|
| DE | 10109797 | 9/2002 |
| JP | 2011049089 | 3/2011 |

(Continued)

OTHER PUBLICATIONS

"Office Action of Japan Counterpart Application" with English translation thereof, dated Jun. 27, 2023, p. 1-p. 8.

*Primary Examiner* — Xanthia C Cunningham
(74) *Attorney, Agent, or Firm* — JCIPRNET (57) ABSTRACT

The disclosure provides a cable connection structure of a power control unit that can improve the work efficiency of assembling the power control unit. A power control unit 10 is attached to an upper portion of a motor case 12 that houses a motor. The power control unit 10 has a unit-side terminal 24 connected to a power supply passage inside the power control unit 10. The motor case 12 has a cable-side terminal 20 connected to a power supply cable. The unit-side terminal 24 and the cable-side terminal 20 are arranged to face each other in an up-and-down direction at an abutting portion between a lower surface of the power control unit 10 and an upper surface of the motor case 12. The unit-side terminal 24 and the cable-side terminal 20 are connected to each other via a conductive spring member.

8 Claims, 6 Drawing Sheets

(56) References Cited

U.S. PATENT DOCUMENTS

| | | | |
|---|---|---|---|
| 2003/0173920 A1* | 9/2003 | Tominaga | B62D 5/0406 318/432 |
| 2003/0200761 A1* | 10/2003 | Funahashi | F04C 29/0085 62/228.4 |
| 2007/0296290 A1* | 12/2007 | Tsukashima | H02K 5/225 310/71 |
| 2013/0134840 A1* | 5/2013 | Murata | E02F 9/2075 310/67 R |
| 2014/0203676 A1 | 7/2014 | Triantos et al. | |
| 2016/0218584 A1* | 7/2016 | Fukushima | H02K 5/225 |
| 2016/0243926 A1* | 8/2016 | Yokoi | F02F 1/00 |
| 2018/0022202 A1* | 1/2018 | Urabe | B60K 1/02 180/65.26 |

FOREIGN PATENT DOCUMENTS

| | | |
|---|---|---|
| JP | 2011250645 | 12/2011 |
| JP | 2013067381 | 4/2013 |
| JP | 2017117534 | 6/2017 |
| JP | 2018023217 | 2/2018 |
| JP | 6597512 | 10/2019 |

* cited by examiner

CABLE CONNECTION STRUCTURE OF POWER CONTROL UNIT

CROSS-REFERENCE TO RELATED APPLICATION

This application claims the priority benefits of Japanese application no. 2020-202274, filed on Dec. 4, 2020. The entirety of the above-mentioned patent application is hereby incorporated by reference herein and made a part of this specification.

BACKGROUND

Technical Field

The disclosure relates to a cable connection structure of a power control unit mounted on a vehicle.

Description of Related Art

In many hybrid vehicles and electric vehicles, a power control unit (PCU) is attached to an upper portion of a motor case in which a motor for driving is housed. The power control unit converts the DC power of a battery into high-voltage AC power suitable for driving the motor, and steps down the AC power generated by the motor and converts the AC power into DC power to charge the battery. The battery is usually arranged at a position separated from the power control unit, and the battery and the power control unit are connected by a power supply cable (see, for example, Patent Document 1).

A power supply passage inside the power control unit and the power supply cable are electrically connected by connectors. The connector on the power supply cable side is electrically connected to the connector on the power control unit side by inserting a pin or the like, and the connectors are fixed to each other by bolting or the like.

RELATED ART

Patent Document

[Patent Document 1] Japanese Patent No. 6597512

Problems to be Solved

In the cable connection structure of the power control unit described above, it is required to electrically connect the connector on the power supply cable side to the connector on the power control unit side by inserting a pin or the like, and then fix the connectors to each other by bolting or the like. Therefore, apart from fixing the power control unit to the motor case, complicated connection work between the connectors must be performed. In addition, since multiple parts are densely arranged in an engine room, it is difficult to connect the connectors in a narrow space, which is one factor that narrows the layout of the connection position of the power supply cable.

SUMMARY

A cable connection structure of a power control unit according to the disclosure adopts the following configuration. The cable connection structure of the power control unit according to an embodiment of the disclosure is for connecting the power control unit (for example, the power control unit 10 of the embodiment) that controls electric power supplied to a motor and a power supply cable (for example, the power supply cable 13 of the embodiment) connected to a battery, in which the power control unit is attached to an upper portion of a motor case (for example, the motor case 12 of the embodiment) that houses the motor. The power control unit includes a unit-side terminal (for example, the unit-side terminal 24 of the embodiment) connected to a power supply passage inside the power control unit. The motor case includes a cable-side terminal (for example, the cable-side terminal 20 of the embodiment) connected to the power supply cable. The unit-side terminal and the cable-side terminal are arranged to face each other in an up-and-down direction at an abutting portion between a lower surface of the power control unit and an upper surface of the motor case, and are connected to each other via a conductive spring member (for example, the coil spring 21 of the embodiment).

A cable connection structure of a power control unit according to another embodiment of the disclosure is for connecting the power control unit (for example, the power control unit 10A of the embodiment) that controls electric power supplied to a motor and a power supply cable connected to a battery, in which the power control unit is attached to an upper portion of a motor case (for example, the motor case 12A of the embodiment) that houses the motor. The power control unit includes a unit-side terminal (for example, the unit-side terminal 24A of the embodiment) connected to a power supply passage inside the power control unit. The motor case includes a cable-side terminal (for example, the cable-side terminal 20A of the embodiment) connected to the power supply cable. The unit-side terminal and the cable-side terminal are arranged to face each other in an up-and-down direction at an abutting portion between a lower surface of the power control unit and an upper surface of the motor case, and at least one of the unit-side terminal and the cable-side terminal is pressed by a spring member (for example, the coil spring 30 of the embodiment) in a direction of contacting a counterpart terminal.

BRIEF DESCRIPTION OF THE DRAWINGS

(a) and (b) of FIG. 6 are cross-sectional views similar to FIG. 5 according to another embodiment.

DESCRIPTION OF THE EMBODIMENTS

The disclosure provides a cable connection structure of a power control unit that can improve the workability of assembling the power control unit.

Means for Solving the Problems

A cable connection structure of a power control unit according to the disclosure adopts the following configuration. The cable connection structure of the power control unit according to an embodiment of the disclosure is for connecting the power control unit (for example, the power control unit 10 of the embodiment) that controls electric power supplied to a motor and a power supply cable (for example, the power supply cable 13 of the embodiment) connected to a battery, in which the power control unit is attached to an upper portion of a motor case (for example, the motor case 12 of the embodiment) that houses the motor. The power control unit includes a unit-side terminal (for example, the unit-side terminal 24 of the embodiment) connected to a power supply passage inside the power control unit. The motor case includes a cable-side terminal (for example, the cable-side terminal 20 of the embodiment) connected to the power supply cable. The unit-side terminal and the cable-side terminal are arranged to face each other in an up-and-down direction at an abutting portion between a lower surface of the power control unit and an upper surface of the motor case, and are connected to each other via a conductive spring member (for example, the coil spring 21 of the embodiment).

With the above configuration, during assembly of the power control unit and the motor case, when the power control unit is mounted on the upper surface of the motor case, the unit-side terminal and the cable-side terminal are kept in the connected state while the conductive spring member is elastically deformed. At this time, the spring member can absorb the manufacturing error of each part and keep the unit-side terminal and the cable-side terminal in the connected state.

A cable connection structure of a power control unit according to another embodiment of the disclosure is for connecting the power control unit (for example, the power control unit 10A of the embodiment) that controls electric power supplied to a motor and a power supply cable connected to a battery, in which the power control unit is attached to an upper portion of a motor case (for example, the motor case 12A of the embodiment) that houses the motor. The power control unit includes a unit-side terminal (for example, the unit-side terminal 24A of the embodiment) connected to a power supply passage inside the power control unit. The motor case includes a cable-side terminal (for example, the cable-side terminal 20A of the embodiment) connected to the power supply cable. The unit-side terminal and the cable-side terminal are arranged to face each other in an up-and-down direction at an abutting portion between a lower surface of the power control unit and an upper surface of the motor case, and at least one of the unit-side terminal and the cable-side terminal is pressed by a spring member (for example, the coil spring 30 of the embodiment) in a direction of contacting a counterpart terminal.

With the above configuration, during assembly of the power control unit and the motor case, when the power control unit is mounted on the upper surface of the motor case, the unit-side terminal and the cable-side terminal are kept in contact with each other while the spring member is elastically deformed. At this time, the spring member can absorb the manufacturing error of each part and keep the unit-side terminal and the cable-side terminal in the connected state.

The motor case and the power control unit may be arranged in a front compartment (for example, the engine room 2 of the embodiment) in front of a passenger compartment of a vehicle. The battery may be arranged at a position rearward of the front compartment. The motor case and the power control unit may have rear regions arranged at positions below a dash upper panel (for example, the dash upper panel 3 of the embodiment) in the front compartment. The unit-side terminal and the cable-side terminal may be respectively arranged in the rear regions of the motor case and the power control unit.

In this case, since the power supply cable is pulled out from the rear regions of the motor case and the power control unit toward the battery, the power supply cable can be shortened. Further, in this case, the rear regions of the motor case and the power control unit are arranged in the narrow space below the dash upper panel, but since it is not required to perform complicated connection work for the power supply cable in the rear region, the connection of the power supply cable is not hindered.

An annular seal member (for example, the seal member 26 of the embodiment) that surrounds a peripheral region of a connection between the unit-side terminal and the cable-side terminal may be arranged between the motor case and the power control unit.

In this case, water droplets can be prevented from adhering to the connection between the unit-side terminal and the cable-side terminal with a simple structure.

Effects

According to the disclosure, when the power control unit is mounted on the upper surface of the motor case, the spring member can absorb the manufacturing error of each part and keep the unit-side terminal and the cable-side terminal in the connected state. When the disclosure is adopted, the workability of assembling the power control unit can be improved because it is not required to perform complicated connection work for the power supply cable apart from the connection work of the power control unit and the motor case.

Hereinafter, embodiments of the disclosure will be described with reference to the drawings. In addition, an arrow FR pointing to the front of a vehicle, an arrow UP pointing to the upper side of the vehicle, and an arrow LH pointing to the left side of the vehicle are marked at appropriate positions in the drawings.

Figure 1:
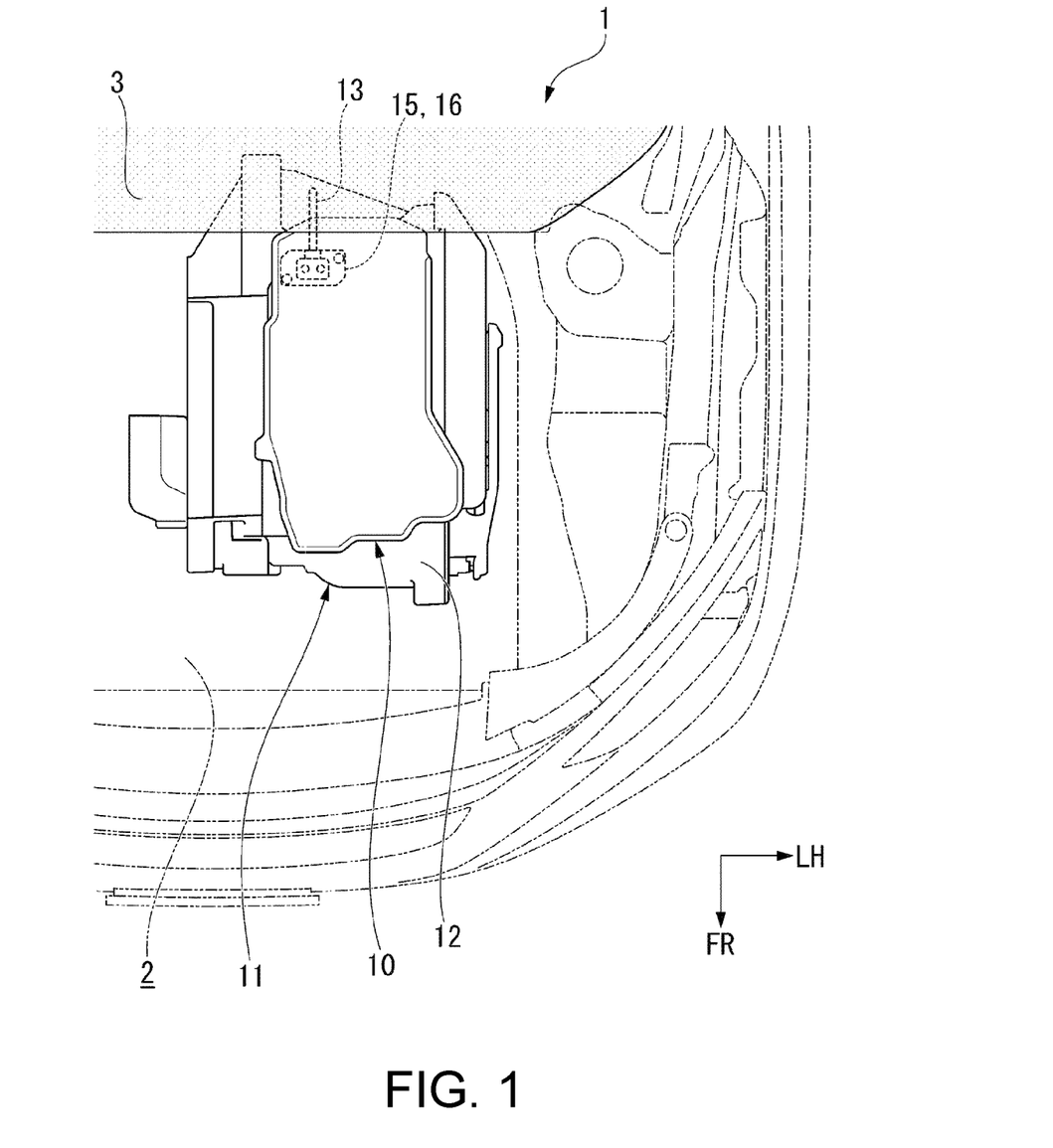
FIG. 1 is a plan view of a vehicle equipped with an assembly of a power control unit and a motor unit according to an embodiment.

FIG. 1 is a plan view of a vehicle 1 equipped with an assembly of a power control unit 10 and a motor unit 11. The vehicle 1 of the present embodiment is a hybrid vehicle including an engine and a motor (not shown). The motor unit 11 is integrally assembled to an end portion of the engine (not shown) on the outer side in a vehicle width direction. In the motor unit 11, a motor for driving the vehicle and a generator are housed inside a motor case 12. A power control unit 10 (PDU: Power Drive Unit) is attached to an upper portion of the motor case 12. The power control unit 10 boosts the DC power of a high-voltage battery (hereinafter, referred to as "battery") (not shown) mounted on the vehicle 1 to a predetermined voltage and converts the DC power into AC power suitable for driving the motor. Further, the power control unit 10 converts the AC power regenerated by the motor and the AC power generated by the generator into DC power and steps down the DC power to a predetermined voltage to charge the battery.

The assembly of the power control unit 10 and the motor unit 11 is arranged together with the engine in an engine room 2 (front compartment) in front of a passenger compartment. Reference numeral 3 in FIG. 1 is a dash upper panel arranged above a rear portion of the engine room 2. A rear region of the assembly of the power control unit 10 and the motor unit 11 is arranged below the dash upper panel 3. A power supply cable 13 to be connected to the battery is connected to a lower surface side of the rear region of the power control unit 10. The battery is arranged below a floor on the rear side of the vehicle with respect to the engine room 2 (front compartment).

Figure 2:
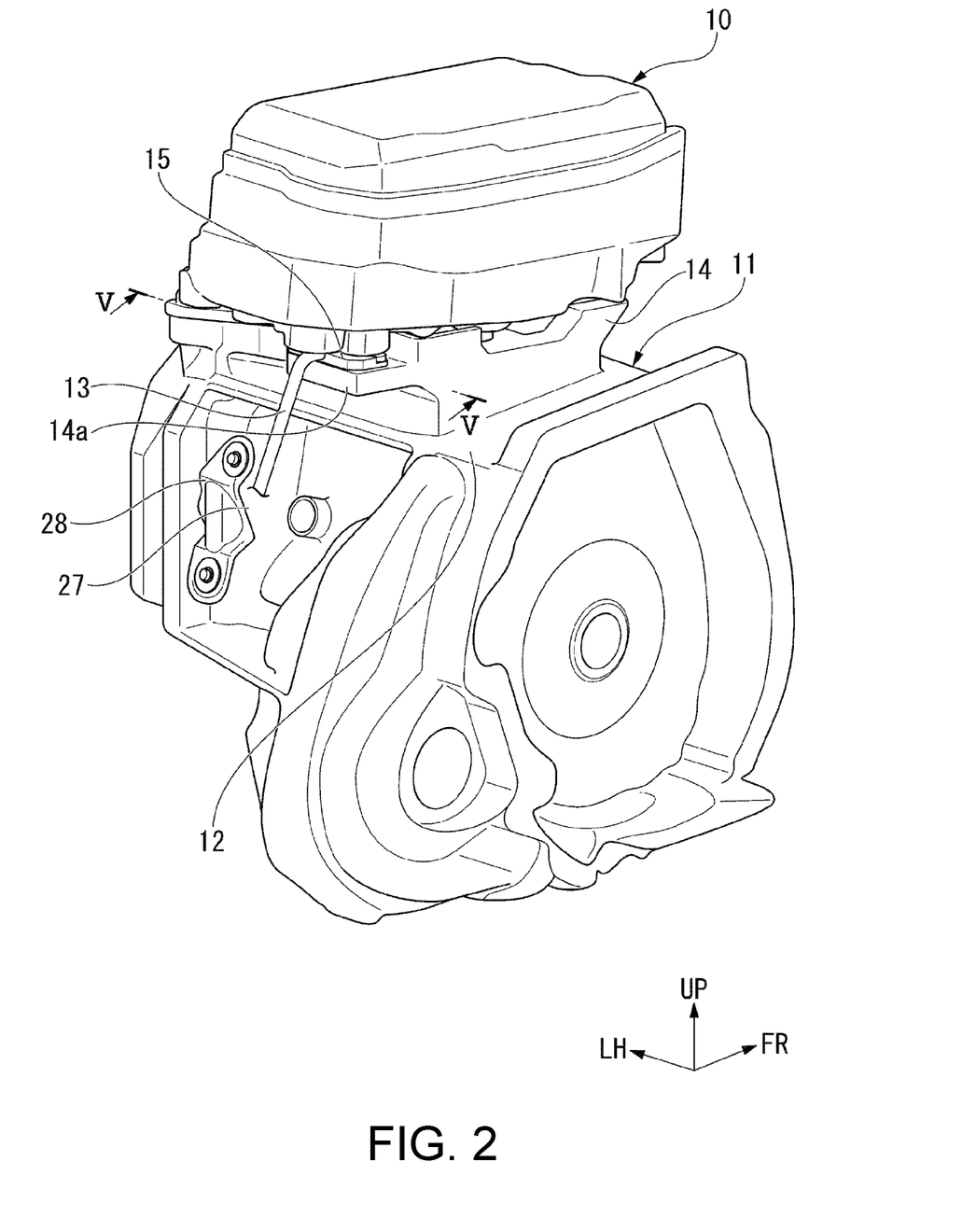
FIG. 2 is a perspective view of the assembly of the power control unit and the motor unit according to an embodiment.
Figure 3:
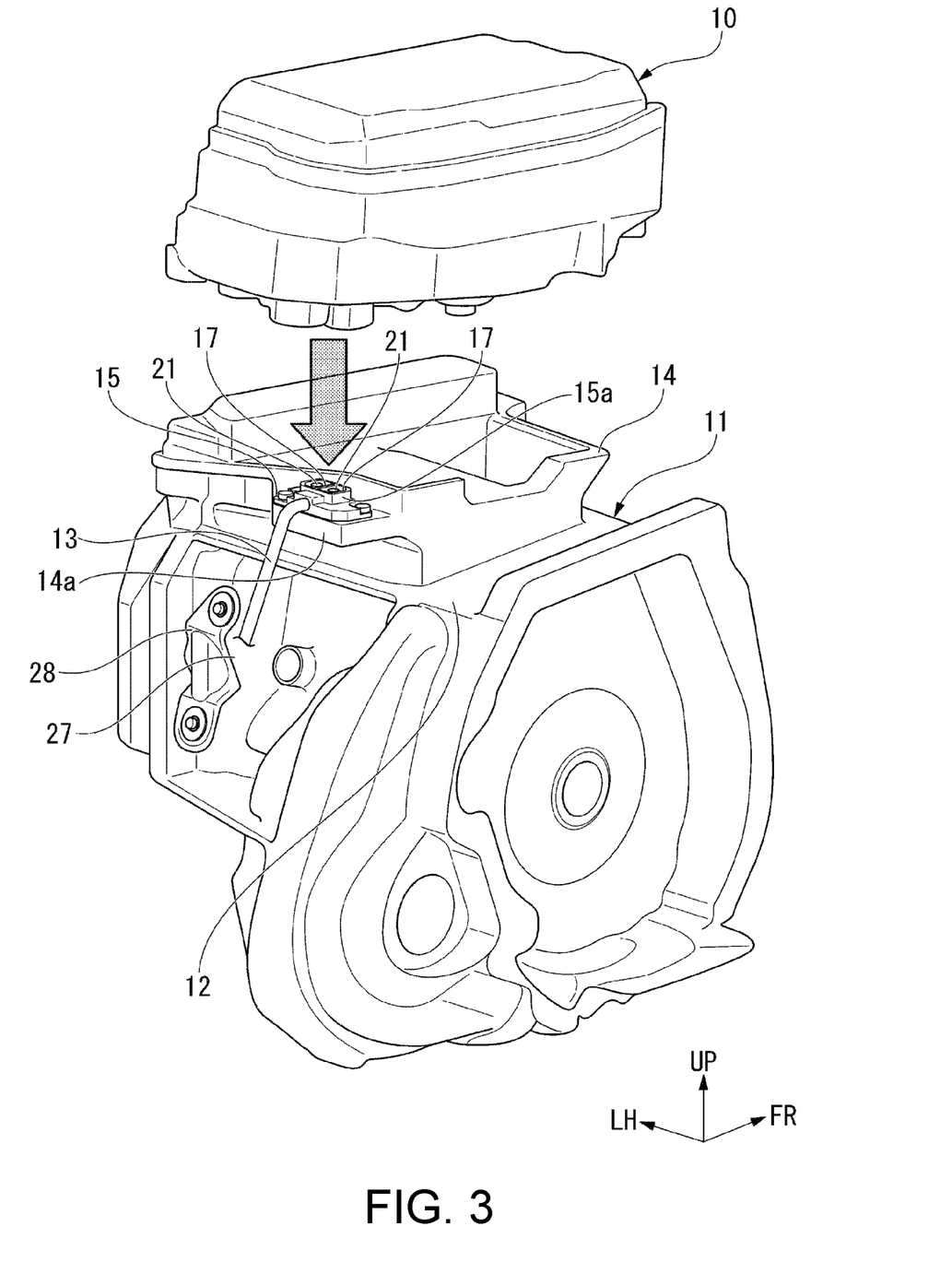
FIG. 3 is an exploded perspective view showing an assembled state of the power control unit and the motor unit according to an embodiment.
Figure 4:
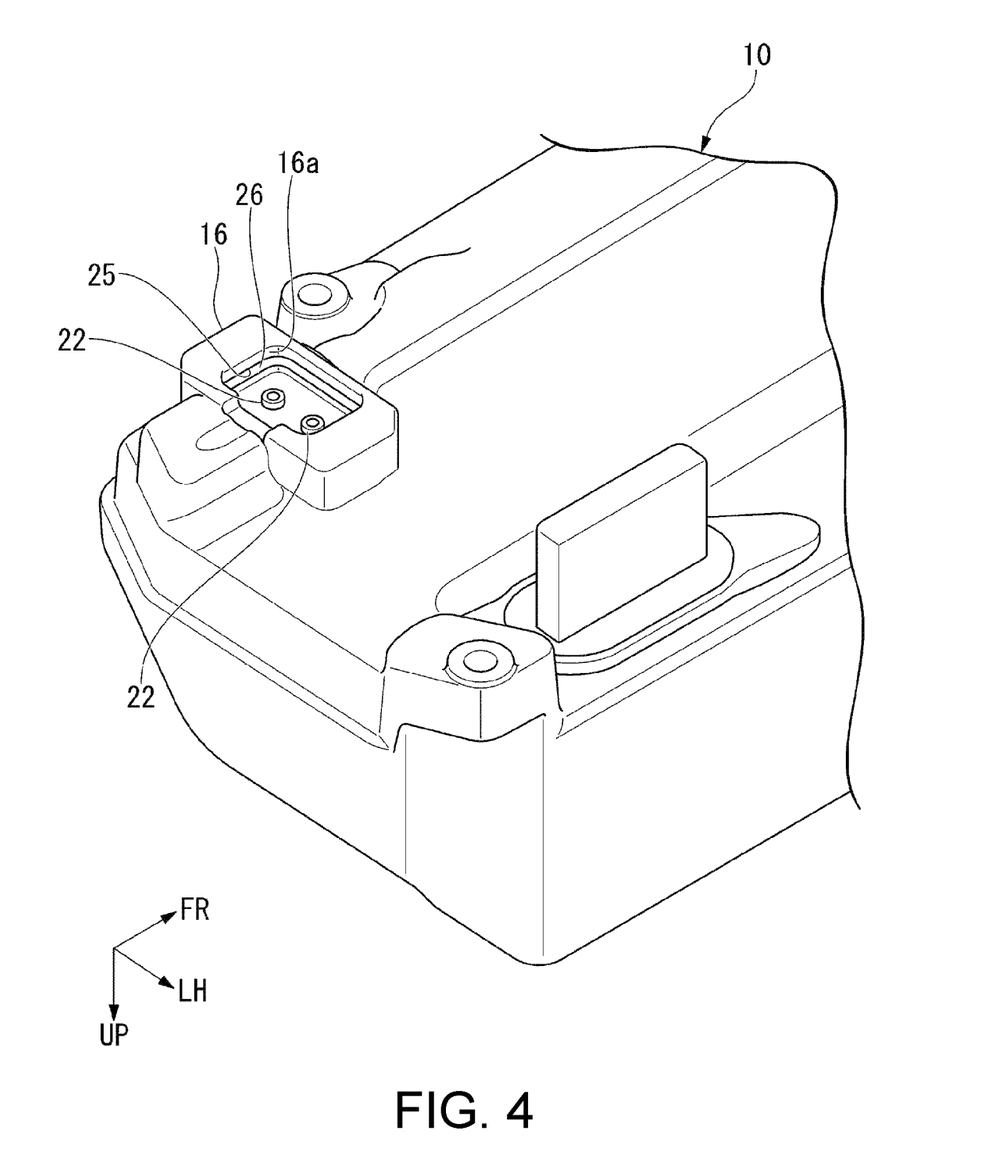
FIG. 4 is a perspective view of the power control unit according to an embodiment as viewed from the lower side.
Figure 5:
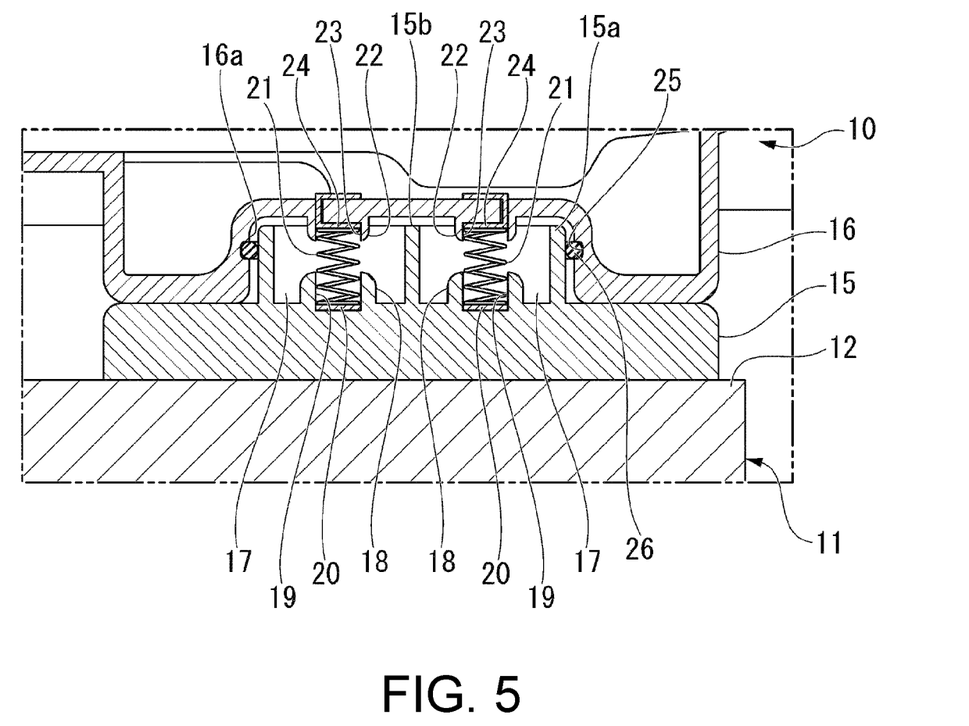
FIG. 5 is a cross-sectional view taken along the line V-V of FIG. 2.

FIG. 2 is a view of the assembly of the power control unit 10 and the motor unit 11 as viewed from the rear upper side of the vehicle 1, and FIG. 3 is a view in which the power control unit 10 and the motor unit 11 are separated and viewed from the rear upper side of the vehicle 1. Further, FIG. 4 is a perspective view of the rear region of the power control unit 10 as viewed from below, and FIG. 5 is a cross-sectional view taken along the line V-V of FIG. 2. A fixing block 14 to which the power control unit 10 is fastened and fixed is integrally formed on the upper portion of the motor case 12. At a rear end portion of the fixing block 14, a rectangular plate-shaped shelf portion 14*a* projecting toward the rear side of the vehicle is provided. A cable-side connector 15 is fixed to an upper surface of the shelf portion 14*a* by bolting or the like. Further, a unit-side connector 16 is fixed at a position facing the cable-side connector 15 on the lower surface of the rear region of the block of the power control unit 10.

As shown in FIG. 3 and FIG. 5, a pair of terminal housing portions 17 are provided on an upper surface of the cable-side connector 15. The pair of terminal housing portions 17 are formed by partitioning the center of a tubular wall 15*a*, which is rectangular in the horizontal cross section, in a longitudinal direction with a partition wall 15*b*. A boss portion 18 is projected from a bottom portion of each terminal housing portion 17, and a substantially circular recess 19 is formed in the center of the boss portion 18. A cable-side terminal 20 to be connected to an end portion of the power supply cable 13 (end portion on the side opposite to the battery) is arranged at a bottom portion of each recess 19. Further, a lower region of a conductive coil spring 21 (spring member) is housed in the recess 19 so that a lower end portion contacts the cable-side terminal 20. The coil spring 21 is a coil-shaped compression spring arranged with an axial direction directed in an up-and-down direction.

As shown in FIG. 4 and FIG. 5, the unit-side connector 16 is formed with a substantially rectangular fitting hole 16*a* into which the tubular wall 15*a* of the cable-side connector 15 is fitted. A similar boss portion 22 is projected from a bottom portion of the fitting hole 16*a* at a position facing each boss portion 18 of the cable-side connector 15. A circular recess 23 is formed in each boss portion 22. A unit-side terminal 24 to be connected to a power supply passage (for example, bus bar) (not shown) inside the power control unit 10 is arranged at a bottom portion of each recess 23. When the power control unit 10 is mounted on the upper portion (fixing block 14) of the motor case 12, the unit-side terminal 24 arranged in each recess 23 faces the corresponding cable-side terminal 20 of the cable-side connector 15 in the up-and-down direction. Therefore, the unit-side terminal 24 and the cable-side terminal 20 are arranged to face each other in the up-and-down direction at an abutting portion between the lower surface of the power control unit 10 and the upper surface of the motor case 12.

The upper end portions of the coil springs 21 housed in the pair of recesses 19 of the cable-side connector 15 are housed in the corresponding recesses 23 of the unit-side connector 16 and contact the unit-side terminals 24 in the recesses 23. At this time, the coil spring 21 contacts the cable-side terminal 20 and the unit-side terminal 24 while being compressed and deformed, whereby the cable-side terminal 20 and the unit-side terminal 24 are conducted.

Further, a holding groove 25 that is annularly continuous in a peripheral region of the fitting hole 16*a* is formed on an inner peripheral surface of the fitting hole 16*a* of the unit-side connector 16. An annular seal member 26 is attached to the holding groove 25. When the tubular wall 15*a* of the cable-side connector 15 is fitted into the fitting hole 16*a* of the unit-side connector 16, the seal member 26 attached to the holding groove 25 contacts an outer peripheral surface of the tubular wall 15*a* while being elastically deformed. As a result, the seal member 26 seals a peripheral region of a connection between the unit-side terminal 24 and the cable-side terminal 20 from the outside.

In addition, as shown in FIG. 2 and FIG. 3, the power supply cable 13 pulled out from the cable-side connector 15 is routed downward along the rear surface of the motor case 12 and then routed in the direction of the motor on the rear side of the vehicle. The power supply cable 13 pulled out from the cable-side connector 15 is routed along a recess 27 (a portion adjacent to a convex portion 28 protruding toward the rear of the vehicle) formed on the rear surface of the motor case 12. Therefore, even if an impact load is input in a front-and-rear direction of the vehicle 1 and causes the motor case 12 to be displaced to the rear side of the vehicle, the power supply cable 13 is protected by the convex portion 28 that protrudes rearward from the rear surface of the motor case 12.

When the power control unit 10 is attached to the motor case 12, the cable-side connector 15 and the unit-side connector 16 are attached in advance to the upper surface of the motor case 12 and the lower surface of the power control unit 10. In this state, the power control unit 10 is mounted on the upper surface (fixing block 14) of the motor case 12 while the power control unit 10 is aligned with the motor case 12 so that the unit-side connector 16 and the cable-side connector 15 face each other in the up-and-down direction. At this time, the tubular wall 15*a* of the cable-side connector 15 is fitted into the fitting hole 16*a* of the unit-side connector 16, and the upper end portion of the coil spring 21 held by the cable-side connector 15 comes into contact with the unit-side terminal 24 of the unit-side connector 16. At this time, the coil spring 21 is compressed and deformed to keep the cable-side terminal 20 and the unit-side terminal 24 in a connected state.

Thereafter, the power control unit 10 is fastened and fixed to the motor case 12. When the power control unit 10 is fixed to the motor case 12 in this way, the cable-side terminal 20 and the unit-side terminal 24 are connected through the coil spring 21, and the peripheral region of the connection between the cable-side terminal 20 and the unit-side terminal 24 is sealed by the seal member 26.

As described above, in the cable connection structure of the power control unit 10 of the present embodiment, the unit-side terminal 24 and the cable-side terminal 20 are arranged to face each other in the up-and-down direction at the abutting portion between the lower surface of the power control unit 10 and the upper surface of the motor case 12, and are connected to each other via the conductive coil spring 21. Therefore, when the power control unit 10 is mounted on the upper surface of the motor case 12, the coil spring 21 (spring member) can absorb the manufacturing error of each part and keep the unit-side terminal 24 and the cable-side terminal 20 in the connected state. Therefore, when the cable connection structure of the present embodiment is adopted, it is not required to perform complicated connection work for the power supply cable 13 apart from the connection work of the power control unit 10 and the motor case 12, and the workability of assembling the power control unit 10 can be improved.

Further, in the case of the present embodiment, the rear regions of the motor case 12 and the power control unit 10 are arranged at positions below the dash upper panel 3 in the engine room 2 (front compartment), and the unit-side terminal 24 and the cable-side terminal 20 are arranged in the rear regions of the motor case 12 and the power control unit 10. This arrangement can be realized because it is not required to perform complicated connection work for the power supply cable 13 below the dash upper panel 3. Then, in the present embodiment, the power supply cable 13 is pulled out from the rear regions of the motor case 12 and the power control unit 10 toward the battery, so the power supply cable 13 can be shortened.

Furthermore, in the cable connection structure of the power control unit 10 of the present embodiment, the annular seal member 26 that surrounds the peripheral region of the connection between the unit-side terminal 24 and the cable-side terminal 20 is arranged between the motor case 12 and the power control unit 10. Therefore, with a simple structure, water droplets can be prevented from adhering to the connection between the unit-side terminal 24 and the cable-side terminal 20.

Figure 6:
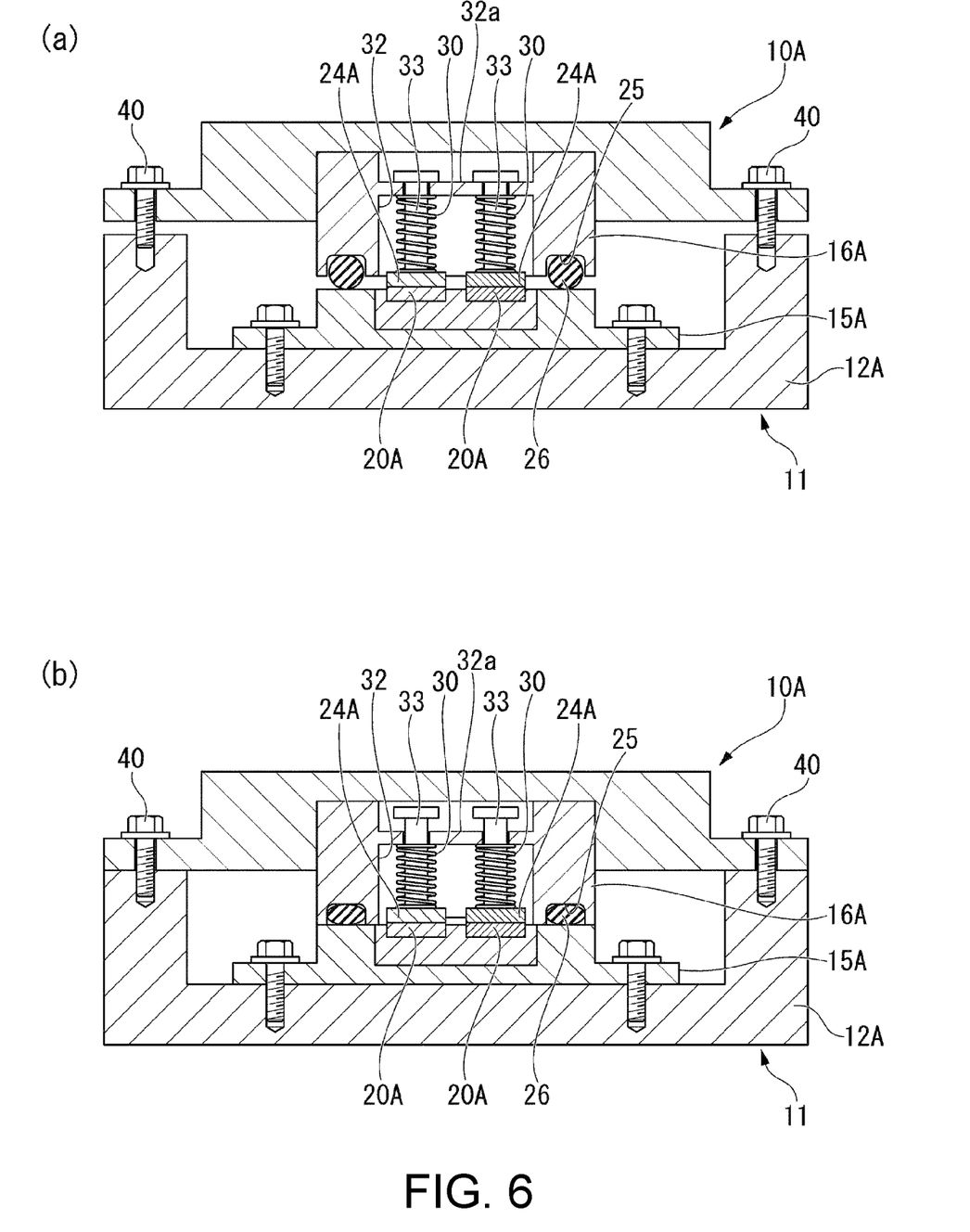

Other Embodiments (a) and (b) of FIG. 6 are cross-sectional views of an assembly of a power control unit 10A and a motor case 12A according to another embodiment. (a) of FIG. 6 shows a state before the power control unit 10A is fastened and fixed to the upper surface of the motor case 12A by bolts 40, and (b) of FIG. 6 shows a state where the power control unit 10A is fastened and fixed to the upper surface of the motor case 12A by the bolts 40. In the cable connection structure of the power control unit 10A of the present embodiment, similar to the above-described embodiment, a unit-side connector 16A and a cable-side connector 15A are attached to the lower surface of the rear region of the power control unit 10A and the upper surface of the rear region of the motor case 12A, respectively. A unit-side terminal 24A and a cable-side terminal 20A are arranged on the unit-side connector 16A and the cable-side connector 15A to face each other in the up-and-down direction at the abutting portion between the lower surface of the power control unit 10A and the upper surface of the motor case 12A. However, the unit-side terminal 24A of the present embodiment is attached to the unit-side connector 16A so as to be displaceable in the up-and-down direction.

A pair of cable-side terminals 20A are fixed to the upper surface of the cable-side connector 15A. A recess 32 is formed on the lower surface of the unit-side connector 16A, and a conductive support pin 33 is supported on a bottom wall 32a of the recess 32 so as to be vertically displaceable. The support pin 33 is electrically connected to a conductive passage (not shown) inside the power control unit 10A on the upper surface side of the bottom wall 32a. The unit-side terminal 24A is attached to a lower end portion of the support pin 33. The unit-side terminal 24A is electrically connected to the conductive passage in the power control unit 10A via the support pin 33. A coil spring 30 (spring member) for urging the unit-side terminal 24A downward is arranged on an outer peripheral side of the support pin 33. A material of the coil spring 30 may be a conductive member or a non-conductive member. When the power control unit 10A is positioned and mounted on the upper surface of the motor case 12A, the coil spring 30 presses the unit-side terminal 24A against the upper surface of the cable-side terminal 20A (counterpart terminal) while being compressed and deformed.

Further, an annular holding groove 25 is formed on an outer peripheral edge portion of the recess 32 on the lower surface of the unit-side connector 16A. A seal member 26 is attached to the holding groove 25 to contact a region surrounding the outer side of the pair of cable-side terminals 20A on the upper surface of the cable-side connector 15A.

When the power control unit 10A is attached to the motor case 12A, the cable-side connector 15A and the unit-side connector 16A are attached in advance to the upper surface of the motor case 12A and the lower surface of the power control unit 10A. In this state, as shown in (a) of FIG. 6, the power control unit 10A is mounted on the upper surface of the motor case 12A while the power control unit 10A is aligned with the motor case 12A so that the unit-side connector 16A and the cable-side connector 15A face each other in the up-and-down direction. At this time, the unit-side terminal 24A supported by the unit-side connector 16A is urged by the coil spring 30 and comes into contact with the upper surface of the cable-side terminal 20A.

Thereafter, the power control unit 10A is fastened and fixed to the motor case 12A by the bolts 40. When the power control unit 10A is fixed to the motor case 12A in this way, the unit-side terminal 24A is pressed against the upper surface of the cable-side terminal 20A by the coil spring 30, and in this state, the unit-side terminal 24A and the cable-side terminal 20A are kept in the connected state. In addition, at this time, the peripheral region of the connection between the cable-side terminal 20A and the unit-side terminal 24A is sealed by the seal member 26.

As described above, in the cable connection structure of the power control unit 10A of the present embodiment, the unit-side terminal 24A and the cable-side terminal 20A are arranged to face each other in the up-and-down direction at the abutting portion between the lower surface of the power control unit 10A and the upper surface of the motor case 12A, and the unit-side terminal 24A is pressed by the coil spring 30 (spring member) in the direction of contacting the cable-side terminal 20A. Therefore, when the power control unit 10A is mounted on the upper surface of the motor case 12A, the coil spring 30 can absorb the manufacturing error of each part and keep the unit-side terminal 24A and the cable-side terminal 20A in the connected state. Therefore, when the cable connection structure of the present embodiment is adopted, it is not required to perform complicated connection work for the power supply cable 13 apart from the connection work of the power control unit 10A and the motor case 12A, and the workability of assembling the power control unit 10A can be improved. In the above-described example, the unit-side terminal 24A is pressed by the coil spring 30 (spring member) in the direction of contacting the cable-side terminal 20A. However, on the contrary, the cable-side terminal 20A may be pressed by the spring member in the direction of contacting the unit-side terminal 24A. In addition, the unit-side terminal 24A and the cable-side terminal 20A may be respectively pressed by spring members so as to be pressed in the directions of the counterpart terminals.

Furthermore, in the case of the present embodiment, since the annular seal member 26 that surrounds the peripheral region of the connection between the unit-side terminal 24A and the cable-side terminal 20A is also arranged between the motor case 12A and the power control unit 10A, water droplets can be prevented from adhering to the connection between the unit-side terminal 24A and the cable-side terminal 20A with a simple structure.

The disclosure is not limited to the above-described embodiments, and various changes in design can be made without departing from the gist of the disclosure. For example, in the above-described embodiments, the power control unit is mounted on a hybrid vehicle, but the power control unit may also be mounted on an electric vehicle not equipped with an engine. Further, the form of the spring member for pressing the terminal is not limited to a coil spring, and may be other forms.

What is claimed is:

1. A cable connection structure of a power control unit for connecting the power control unit that controls electric power supplied to a motor and a power supply cable connected to a battery, in which the power control unit is attached to an upper portion of a motor case that houses the motor, wherein
   the power control unit comprises a unit-side terminal connected to a power supply passage inside the power control unit,
   the motor case comprises a cable-side terminal connected to the power supply cable, and
   the unit-side terminal and the cable-side terminal are arranged to face each other in an up-and-down direction at an abutting portion between a lower surface of the power control unit and an upper surface of the motor case, and are connected to each other via a conductive spring member.

2. The cable connection structure of the power control unit according to claim 1, wherein the motor case and the power control unit are arranged in a front compartment in front of a passenger compartment of a vehicle,
   the battery is arranged at a position rearward of the front compartment,
   the motor case and the power control unit have rear regions arranged at positions below a dash upper panel in the front compartment, and
   the unit-side terminal and the cable-side terminal are respectively arranged in the rear regions of the motor case and the power control unit.

3. The cable connection structure of the power control unit according to claim 1, wherein an annular seal member that surrounds a peripheral region of a connection between the unit-side terminal and the cable-side terminal is arranged between the motor case and the power control unit.

4. The cable connection structure of the power control unit according to claim 2, wherein an annular seal member that surrounds a peripheral region of a connection between the unit-side terminal and the cable-side terminal is arranged between the motor case and the power control unit.

5. A cable connection structure of a power control unit for connecting the power control unit that controls electric power supplied to a motor and a power supply cable connected to a battery, in which the power control unit is attached to an upper portion of a motor case that houses the motor, wherein
   the power control unit comprises a unit-side terminal connected to a power supply passage inside the power control unit,
   the motor case comprises a cable-side terminal connected to the power supply cable, and
   the unit-side terminal and the cable-side terminal are arranged to face each other in an up-and-down direction at an abutting portion between a lower surface of the power control unit and an upper surface of the motor case, and at least one of the unit-side terminal and the cable-side terminal is pressed by a spring member in a direction of contacting a counterpart terminal.

6. The cable connection structure of the power control unit according to claim 5, wherein the motor case and the power control unit are arranged in a front compartment in front of a passenger compartment of a vehicle,
   the battery is arranged at a position rearward of the front compartment,
   the motor case and the power control unit have rear regions arranged at positions below a dash upper panel in the front compartment, and
   the unit-side terminal and the cable-side terminal are respectively arranged in the rear regions of the motor case and the power control unit.

7. The cable connection structure of the power control unit according to claim 5, wherein an annular seal member that surrounds a peripheral region of a connection between the unit-side terminal and the cable-side terminal is arranged between the motor case and the power control unit.

8. The cable connection structure of the power control unit according to claim 6, wherein an annular seal member that surrounds a peripheral region of a connection between the unit-side terminal and the cable-side terminal is arranged between the motor case and the power control unit.

* * * * *